(12) United States Patent
Srinivasamurthy et al.

(10) Patent No.: US 10,371,879 B2
(45) Date of Patent: Aug. 6, 2019

(54) LIGHT UNIT WITH AN EXTENDED LIGHT EMISSION SURFACE

(71) Applicant: Goodrich Lighting Systems GmbH, Lippstadt (DE)

(72) Inventors: Ramesh Srinivasamurthy, Kamataka (IN); Christian Schoen, Mainz (DE); Andre Hessling-von Heimendahl, Koblenz (DE); Anil Kumar Jha, Lippstadt (DE)

(73) Assignee: Goodrich Lighting Systems GmbH, Lippstadt (DE)

( * ) Notice: Subject to any disclaimer, the term of this patent is extended or adjusted under 35 U.S.C. 154(b) by 377 days.

(21) Appl. No.: 14/980,456

(22) Filed: Dec. 28, 2015

(65) Prior Publication Data
US 2016/0195666 A1     Jul. 7, 2016

(30) Foreign Application Priority Data
Jan. 2, 2015   (EP) ..................................... 15150019

(51) Int. Cl.
*F21V 8/00* (2006.01)
*B64D 45/00* (2006.01)
*G06F 17/50* (2006.01)

(52) U.S. Cl.
CPC .......... *G02B 6/0043* (2013.01); *B64D 45/00* (2013.01); *G02B 6/0021* (2013.01); *G02B 6/0036* (2013.01); *G02B 6/0055* (2013.01); *G02B 6/0061* (2013.01); *G06F 17/5009* (2013.01); *B64D 2045/007* (2013.01); *B64D 2203/00* (2013.01); *G02B 6/002* (2013.01)

(58) Field of Classification Search
CPC .. G02B 6/0043; G02B 6/0055; G02B 6/0021; B64D 45/00
See application file for complete search history.

(56) References Cited

U.S. PATENT DOCUMENTS

| 5,528,709 A * | 6/1996 | Koike ................. G02B 6/0041 362/612 |
| 5,921,651 A | 7/1999 | Ishikawa |
| 2002/0197051 A1 | 12/2002 | Tamura et al. |
| 2004/0095743 A1 | 5/2004 | Yu et al. |

(Continued)

FOREIGN PATENT DOCUMENTS

| EP | 2218960 A1 | 8/2010 |
| EP | 2474846 A1 | 7/2012 |

(Continued)

OTHER PUBLICATIONS

European Search Report for application No. EP15150019.6; dated Jun. 23, 2015, 6 pages.

*Primary Examiner* — William N Harris
(74) *Attorney, Agent, or Firm* — Cantor Colburn LLP (57) ABSTRACT

A light unit with an extended light emission surface includes a light source, and a flat light distribution body having a first principal surface and a second principal surface disposed on opposite sides of the flat light distribution body, wherein the light source is positioned outside of the flat light distribution body, with light emitted by the light source being coupled into the flat light distribution body and being propagated within the flat light distribution body via total internal reflection at the first and second principal surfaces.

13 Claims, 5 Drawing Sheets

(56) References Cited

U.S. PATENT DOCUMENTS

| | | | | |
|---|---|---|---|---|
| 2008/0260329 | A1* | 10/2008 | Epstein | G02B 6/0021 385/32 |
| 2013/0016525 | A1* | 1/2013 | Metzech | B64D 11/0015 362/602 |
| 2014/0009961 | A1* | 1/2014 | Sakaguchi | G02B 6/0055 362/609 |
| 2015/0253492 | A1* | 9/2015 | Kaihotsu | G02B 6/002 362/610 |

FOREIGN PATENT DOCUMENTS

| | | |
|---|---|---|
| EP | 2523040 A1 | 11/2012 |
| JP | 2006278348 A | 10/2006 |
| KR | 20070083084 A | 8/2007 |
| KR | 20080064323 A | 7/2008 |

* cited by examiner

FIG. 5D

LIGHT UNIT WITH AN EXTENDED LIGHT EMISSION SURFACE

FOREIGN PRIORITY

This application claims priority to European Patent Application No. 15 150 019.6 filed Jan. 2, 2015, the entire contents of which is incorporated herein by reference.

TECHNICAL FIELD

The present invention relates to light units with extended light emission surfaces. In particular, the present invention relates to interior aircraft light units with extended light emission surfaces, such as interior aircraft light units, such as exit light units or wash room signal light units, commonly used for conveying signals to the passengers.

BACKGROUND OF THE INVENTION

For exit light units, the Federal Aviation Regulations (FAR) require a fairly even light intensity distribution. In particular, the FAR set limit values for the ratio between the brightest portion of the exit light unit and the least bright portion of the exit light unit on the extended light emission surface. An exemplary limit value for this ratio is 3. In order to satisfy such limit values, prior art approaches have employed very complicated optical structures, commonly employing a large number of light sources. Such approaches have proven to be not satisfactory with respect to their efficiency and their reliability.

Accordingly, it would be beneficial to provide an interior aircraft light unit that is able to satisfy such light intensity ratio requirements, has an improved efficiency and has an acceptable reliability.

SUMMARY

Exemplary embodiments of the invention include a light unit with an extended light emission surface, comprising a light source, and a flat light distribution body having a first principal surface and a second principal surface disposed on opposite sides of the flat light distribution body, wherein the light source is positioned outside of the flat light distribution body, with light emitted by the light source being coupled into the flat light distribution body and being propagated within the flat light distribution body via total internal reflection at the first and second principal surfaces, wherein the first principal surface has a plurality of surface irregularities, wherein light arriving at a surface irregularity at an angle of incidence is reflected at an angle of reflection that is different from the angle of incidence with respect to the first principal surface, with the angle of reflection allowing for the light to be coupled out of the flat light distribution body, and wherein a total irregularity ratio of the first principal surface is defined as a combined area of the plurality of surface irregularities on the first principal surface divided by a total area of the first principal surface and wherein a regional irregularity ratio is defined as a combined area of a subset of the plurality of surface irregularities in a sub-region of the first principal surface divided by a total area of said sub-region of the first principal surface, wherein the first principal surface has at least one square sub-region whose area is 10% of the total area of the first principal surface and whose regional irregularity ratio is at least 50% higher than the total irregularity ratio.

Distributing the surface irregularities in a manner that deviates significantly from a uniform distribution of the surface irregularities allows for achieving a highly uniform output light intensity distribution of the light unit. This can be explained best by comparing the highly non-uniform distribution of the light unit according to above described exemplary embodiment with the hypothetical case of a uniform distribution of surface irregularities. Surface irregularities are an efficient way of coupling light out of a flat light distribution body, where the light is trapped between the first and second principal surfaces via total internal reflection in the absence of such surface irregularities. By changing the path of propagation through the flat light distribution body, the surface irregularities alter the angle of the light with respect to the principal surfaces below the critical angle, which enables coupling out of the light. In this way, localised zones around the surface irregularities are created in which light leaves the light unit. In the hypothetical case of a uniform distribution of the surface irregularities across the first principal surface, different amounts of light are coupled out at the different surface irregularities. The reason for this non-uniform coupling out of the light is the relative positioning of the light source and the flat light distribution body as well as the particular geometry of the flat light distribution body. These two factors lead to a situation where more light arrives at certain surface irregularities, while less light arrives at other surface irregularities. As the surface irregularities provide for local zones of light emission, an overall highly non-uniform output light intensity distribution is the result. By providing at least one sub-region that has a greatly increased density of surface irregularities and/or a greatly increased size of the surface irregularities, light emission in this sub-region is increased as compared to above described hypothetical case. By providing at least one such sub-region with the regional irregularity ratio being at least 50% higher than the total irregularity ratio, the output light intensity distribution can be brought closer to a uniform light intensity distribution than is present in above described hypothetical case of a uniform distribution of surface irregularities. In other words, providing different regional irregularity ratios over the first principal surface allows for bringing the output light intensity distribution of the light unit closer to a uniform output light intensity distribution. This in turn allows for achieving light intensity ratio requirements, as for example required by the FAR.

Such distribution of the light coupled into the flat light distribution body by the light source allows for the provision of light units that are more efficient and more reliable than prior approaches. As a desired distribution of the light may be achieved entirely by the provision of the surface irregularities in different densities across the first principal surface, no complicated optical systems having multiple lenses and/or reflectors, as used in prior approaches, are necessary. Further, as the light distribution across the extended light emission surface may be achieved via the flat light distribution body, it is not necessary to have multiple light sources in different positions across the light unit to achieve a light intensity distribution with a low light intensity ratio, as employed in prior approaches. With previous approaches having multiple light sources, the light sources were operated below their nominal ratings, in order not to have a light unit that is brighter than allowed by FAR requirements. In such cases, the light sources were not operated in an efficient range, thus making the whole light unit inefficient, and were prone to failing due to not being operated in their preferred regime. Accordingly, overall more efficient and more reliable light units can be achieved with above described flat light distribution body.

The term flat light distribution body is used for a structure that has extensions in two dimensions that are significantly greater than the extension in a third dimension. In the exemplary case of an exit light unit in an aircraft, which commonly hangs from the aircraft ceiling or is attached to the aircraft body wall, the two dimensions with greater extension are the width and the height dimension, while the dimension with the lowest extension is the depth dimension. The first and second principal surfaces are those surfaces that substantially extend in those planes comprising the two dimensions of greater extension. In the case of the flat light distribution body being a substantially cuboid structure, the first and second principal surfaces are those surfaces that have the greatest surface area. It is pointed out that the flat light distribution body does not have to be cuboid. Rather, the flat light distribution body can have any other suitable geometric shape, such as a circular, oval, polygonal or other regular or irregular shape. The term flat just specifies that the extension of the flat light distribution body is smaller in one dimension as compared to the two other dimensions in a Cartesian coordinate system.

The expression total internal reflection refers to the arriving of light rays at the first or second principal surfaces at an angle that is larger than the critical angle of the material discontinuity present at the first and second principal surfaces. As a result of the angle of incidence being larger than the critical angle, the light rays are completely reflected and stay within the flat light distribution body. In this way, the light rays propagate within the flat light distribution body from total internal reflection to total internal reflection. Surface irregularities break this light ray propagation from total internal reflection to total internal reflection. In particular, these surface irregularities effect an angle of reflection that is different from the angle of incidence in the frame of reference of the first principal surface. In this way, at least a portion of the light rays that is reflected at the surface irregularities then has an angle of incidence with respect to the first principal surface or with respect to the second principal surface that is below the critical angle, with such angle then leading to the light ray being coupled out of the flat light distribution body.

An important factor for the amount of light being coupled out of the flat light distribution body in a particular zone or region of the flat light distribution body is the regional irregularity ratio in this particular region or zone. The term irregularity ratio refers to a ratio of the combined surface area of the surface irregularities under consideration, divided by the surface area of the first principal surface under consideration. If all surface irregularities and the whole first principal surface are under consideration, said measure is referred to as the total irregularity ratio. If only a sub-region of the whole first principal surface is under consideration, i.e. if an area of a sub-region of the first principal surface is put in relation with the surface area of the surface irregularities in that sub-region, the measure is referred to as regional irregularity ratio. With the regional irregularity ratio being larger than the total irregularity ratio, a larger portion of the light arriving in the sub-region under consideration is coupled out of the flat light distribution body. In this way, the light emissions of different sub-regions, which are subject to different levels of light arriving in these sub-regions, can be approximated or even equaled out.

According to a further embodiment, the first principal surface has two or three or more square sub-regions, with the area of each of the two or three or more square sub-regions being 10% of the total area of the first principal surface and with the regional irregularity ratio of each of the two or three or more square sub-regions being at least 50% higher than the total irregularity ratio. Said two or three or more square sub-regions cover mutually exclusive areas, i.e. they do not overlap.

According to a further embodiment, the regional irregularity ratio of the at least one square sub-region is at least 60%, in particular at least 80%, further in particular at least 100% higher than the total irregularity ratio. It is also possible that there are two or three or more square sub-regions, with the area of each of the two or three or more square sub-regions being 10% of the total area of the first principal surface and with the regional irregularity ratio of each of the two or three or more square sub-regions being at least 50% higher than the total irregularity ratio, wherein a subset of the two or three or more square sub-regions has a regional irregularity ratio that is at least 60%, in particular at least 80%, further in particular at least 100% higher than the total irregularity ratio. These features can also be combined. For example, it is possible that at least one square sub-region has a regional irregularity ratio that is at least 100% higher than the total irregularity ratio, while at least one other square sub-region has a regional irregularity ratio that is at least 50%, but less than 100% higher than the total irregularity ratio. Further combinations are possible as well.

According to a further embodiment, the second principal surface is the extended light emission surface, with light being coupled out of the flat light distribution body at the second principal surface after being reflected at the plurality of surface irregularities on the first principal surface. In this way, light is coupled out of the flat light distribution body after one reflection at a surface irregularity. If the light is not coupled out right after the reflection at the surface irregularity, it stays trapped within the flat light distribution body until it hits another surface irregularity. It is pointed out that not all light hitting a surface irregularity is coupled out of the flat light distribution body when reaching the second principal surface thereafter. It is possible that the angle of reflection is different from the angle of incidence with respect to the first principal surface, but that the angle of reflection is still above the critical angle, such that the light stays trapped within the flat light distribution body.

According to a further embodiment, the first principal surface is the extended light emission surface and the light unit comprises an extended reflector arranged outside of the flat light distribution body alongside the second principal surface, with light being coupled out of the flat light distribution body at the first principal surface after being reflected at the plurality of surface irregularities on the first principal surface and being reflected at the extended reflector. In this case, the first principal surface is both the surface carrying the surface irregularities and the surface acting as the extended light emission surface. This double function of the first principal surface is achieved via the provision of the extended reflector alongside the second principal surface. Whenever light is reflected at a surface irregularity and has an angle of reflection smaller than the critical angle, this light leaves the flat light distribution body at the second principal surface, is reflected by the extended reflector, enters the flat light distribution body again via the second principal surface, and exits the flat light distribution body at the first principal surface.

According to a further embodiment, the extended reflector is a diffuse reflector. In this way, the light exiting the flat light distribution body at the second principal surface is diffusely reflected, contributing to the evening out of the output light intensity distribution of the light unit. In addition to the evening out of the output light intensity distribution via the surface irregularities, which takes place on a larger scale, the diffuse reflector allows for an evening out on a smaller scale and within a smaller angular range. The diffuse reflector is therefore an efficient complement to the surface irregularities for evening out the output light intensity distribution. According to a particular embodiment, the diffuse reflector is a white diffuse reflector. In this way, a very large portion of the light is reflected at the diffuse reflector and used for the output light intensity distribution.

According to a further embodiment, the second principal surface has a plurality of second surface irregularities, wherein light arriving at a second surface irregularity at an angle of incidence is reflected at an angle of reflection that is different from the angle of incidence with respect to the second principal surface, with the angle of reflection allowing for the light to be coupled out of the flat light distribution body. In this way, the coupling out of the light out of the flat light distribution body can be initiated at both the first principal surface and the second principal surface. In this way, a higher degree of freedom is provided for the design of a particular light unit in order to achieve a desired output light intensity distribution. Surface irregularities on the first and second principal surfaces may cooperate to compliment their effects. All the features and modification discussed herein with respect to the surface irregularities on the first principal surface and with respect to the distribution and size of the surface irregularities on the first principal surface, apply to the second surface irregularities in an analogous manner.

According to a further embodiment, both the first and the second principal surfaces are extended light emission surfaces, with light being coupled out of the flat light distribution body at the second principal surface after being reflected at the plurality of surface irregularities on the first principal surface and with light being coupled out of the flat light distribution body at the first principal surface after being reflected at the plurality of second surface irregularities on the second principal surface. In this way, the light unit is able to emit light on opposite sides of the light unit. This is particularly useful for light units that require light emission towards two sides, such as aircraft exit signs hanging from the interior aircraft ceiling.

According to an alternative embodiment, the first principal surface is the extended light emission surface and the light unit comprises an extended reflector arranged outside of the flat light distribution body alongside the second principal surface, with light being coupled out of the flat light distribution body at the first principal surface after being reflected at the plurality of surface irregularities on the first principal surface and being reflected at the extended reflector and with light being coupled out of the flat light distribution body at the first principal surface after being reflected at the plurality of second surface irregularities on the second principal surface. In this way, above discussed benefits of having surface irregularities on both the first and second principal surfaces can be made use of, while all light emission is from the first principal surface, leading to a high output light intensity therefrom.

According to a further embodiment, the light source is an LED light source. LEDs are a particularly power-efficient and reliable kind of light sources. They are particularly useful in the framework of coupling light into the flat light distribution body, because the light distribution is effected by the flat light distribution body, while the LED or LEDs can be operated in their nominal rating, without having to adapt the emitted brightness to particular constraints of the desired output light intensity distribution. In this way, given LEDs can be operated particularly efficiently or particular LEDs can be selected for a desired overall output illumination by the light unit according to their power ratings. According to a particular embodiment, the light source is an LED light source consisting of exactly one LED. It is, however, also possible that two or more LEDs are present for coupling light into the flat light distribution body. The LEDs may be arranged adjacent to each other, thus coupling light into the flat light distribution body from roughly the same position. It is, however, also possible that the two or more LEDs are arranged at completely different positions with respect to the flat light distribution body.

According to a further embodiment, the flat light distribution body has a substantially cuboid shape and the light source is arranged in corner region of the flat light distribution body, with light from the light source being coupled into the flat light distribution body via a light entry surface. It is pointed out that it is also possible that the light source is arranged somewhere else around the perimeter of the substantially cuboid shape of the flat light distribution body. According to a particular embodiment, the light source is arranged between the two planes defined by the first and second principal surfaces. According to a further particular embodiment, the light source may be arranged in a cut-out portion of an overall cuboid shaped body. In other words, the flat light distribution body may be an overall cuboid shaped structure, with a portion thereof being cut out of the cuboid shape for placing the light source therein. In this way, efficient coupling of the light into the flat light distribution body may be achieved.

According to a further embodiment, the light entry surface has a concave shape, when seen from the light source, in a cross-sectional plane parallel to the first principal surface. In this way, a large portion of the light emitted by the light source can be coupled into the flat light distribution body. It is possible that only a small portion of the light of the light source or no light emitted by the light source is reflected by the flat light distribution body, leading to an overall high efficiency of the light unit.

According to a further embodiment, the light entry surface has a convex shape, when seen from the light source, in a cross-sectional plane orthogonal to first principal surface. In this way, a large portion or all of the light emitted by the light source may be refracted at the convex shaped light entry surface in such a way that it then hits the first and second principal surfaces at angles above the critical angle, leading to total internal reflection of the light. In particular, the light may be refracted in a way that all light entering the flat light distribution body is subject to total internal reflection thereafter.

According to a further embodiment, the light entry surface is shaped such that the light emitted by the light source and entering the flat light distribution body via the light entry surface reaches the first and second principal surfaces at angles of incidence of at least 60°. The angles of incidence are defined herein as the angles with respect to the direction normal to the surface under consideration.

According to a further embodiment, the surface connecting the first and second principal surfaces of the flat light distribution body is fully reflective for light within the flat light distribution body. This may be done via any suitable technique of making this connection surface reflective. In this way, no light is emitted by the flat light distribution body, unless it reaches surface irregularities.

According to a further embodiment, a distribution of the plurality of surface irregularities is such that an output light intensity distribution across the extended light emission surface has a ratio between its maximum light intensity and its minimum light intensity of at most 3. In this way, an output light intensity distribution is achieved that is perceived as highly uniform by the observer. In this way, a light unit can be achieved that is highly useful for signaling lights, such as exit lights in an aircraft. With the ratio between the maximum light intensity and the minimum light intensity being at most 3, such light units also satisfy very strict requirements, as given with respect to some interior aircraft lighting.

According to a further embodiment, the plurality of surface irregularities comprises holes in the first principal surface. Such holes may be drilled or milled into the flat light distribution body during the manufacture thereof. It is also possible that the surface irregularities are created by counter sinking, counter boring, etching or any other suitable king of operation. It is also possible that a mechanical force is exerted onto the material of the flat light distribution body at selected locations, leading to the holes/dents in the first principal surface.

According to a further embodiment, the plurality of surface irregularities comprises dots attached to the outside of the first principal surface. Such dots may be glued onto the first principal surface or may be printed thereon. Such dots may be of any suitable material that effects a change between the angle of incidence and the angle of reflection at the surface irregularity.

According to a further embodiment, the diameter of the plurality of surface irregularities is between 0.1 mm and 2 mm, in particular between 0.2 mm and 1.5 mm. The plurality of surface irregularities may be round or oval or polygonal or may have any other suitable form.

According to a further embodiment, the average distance of a surface irregularity to the nearest surface irregularity is between 2 mm and 10 mm, in particular between 3 mm and 7 mm, further in particular around 5 mm.

According to a further embodiment, the light unit has a lens cover or a plurality of lens covers. The one or more lens covers may be arranged along the one or more extended light emission surfaces. According to a particular embodiment, the one or more lens covers may carry markings, which markings may contain and convey the signal information to the observer. Exemplary markings have the shape of letters.

According to a further embodiment, the light unit is an interior aircraft light unit. According to a particular embodiment, the light unit is an exit light unit, in particular an emergency exit light unit, or a wash room signal light unit. Above discussed benefits of high efficiency and high reliability are particularly useful in the aircraft environment, because power is a scarce resource in an aircraft and maintenance is very cumbersome, complex, and expensive.

Exemplary embodiments of the invention further include a method of designing a light unit with an extended light emission surface, comprising the steps of (a) defining a geometry of a flat light distribution body, having a first principal surface, a second principal surface, and a light entry surface, (b) defining a position and a light intensity distribution of a light source, facing the light entry surface, (c) defining a starting pattern of a plurality of surface irregularities on the first principal surface, (d) simulating an operation of the light unit and analysing an output light intensity distribution across the extended light emission surface, (e) determining a maximum light intensity and a minimum light intensity of the output light intensity distribution and determining a ratio between the maximum light intensity and the minimum light intensity, (f) if the ratio between the maximum light intensity and the minimum light intensity is above a predetermined threshold, increasing the number and/or the size of the surface irregularities in regions with low output light intensity values.

By simulating the operation of the light unit and adapting the number or the size of the surface irregularities in regions with low output light intensity values, it is possible to even out the output light intensity distribution of the light unit without the need of performing complex predictive calculations about the light rays travelling through the flat light distribution body. The starting pattern may be a regular distribution of surface irregularities. In particular, the surface irregularities of the starting pattern may be arranged in a grid pattern. In this way, the starting pattern has a uniform distribution of the surface irregularities. It is also possible to provide a random starting pattern of the plurality of surface irregularities, with the random locations being selected in accordance with a uniform distribution. It is also possible to provide the starting pattern on the basis of existing knowledge of the geometry of the flat light distribution body. For example, it is possible to provide a starting pattern that has more surface irregularities in regions that are farther removed from the light source. Such a starting pattern is based on the assumption that, on average, less light reaches the parts of the flat light distribution body that are comparably farther removed from the light source.

The step of increasing the number and/or the size of the surface irregularities in regions with low output light intensity values may be based on different definitions of low output light intensity values. For example, the number and/or the size of the surface irregularities may be increased in regions where the light intensity of the output light intensity distribution is below the average light intensity value. It is also possible that the threshold is not the average light intensity value, but a value between the minimum light intensity and the average light intensity.

According to a further embodiment, step (f) may also include the step of decreasing the number and/or the size of the surface irregularities in regions with high output light intensity values. Again, the threshold for light intensity values being considered high can be the average light intensity value or any other suitable value. In particular, it is possible to decrease the number and/or the size of the surface irregularities in regions where the light intensity values are above a threshold value that is between the average light intensity and the maximum light intensity.

According to a further embodiment, steps (d) to (f) are performed iteratively, until the ratio between the maximum light intensity and the minimum light intensity is below the predetermined threshold. In this way, the pattern of the plurality of surface irregularities may be adjusted in multiple steps, with the respective intermediate results of the analysis of the output light intensity distributions leading to respective decisions about where to increase and/or decrease the number and/or the size of the surface irregularities. In this way, a more and more even output light intensity distribution may be approached over the multiple iterations, such that unintended changes in the output light intensity distribution, effected through changes in the pattern of the plurality of surface irregularities, can be mitigated again. In this way, a fairly well evened-out output light intensity distribution can be achieved without having to build various prototypes for analysing the output light intensity distribution.

According to a further embodiment, the predetermined threshold is between 2 and 5, in particular between 2.5 and 4, further in particular at or around 3.

BRIEF DESCRIPTION OF DRAWINGS

Further exemplary embodiments of the invention are described with reference to the accompanying drawings, wherein:

FIG. 5a-FIG. 5d illustrates an exemplary embodiment of a method for designing an exemplary embodiment of a light unit in accordance with the invention.

DETAILED DESCRIPTION OF THE INVENTION

Figure 1:
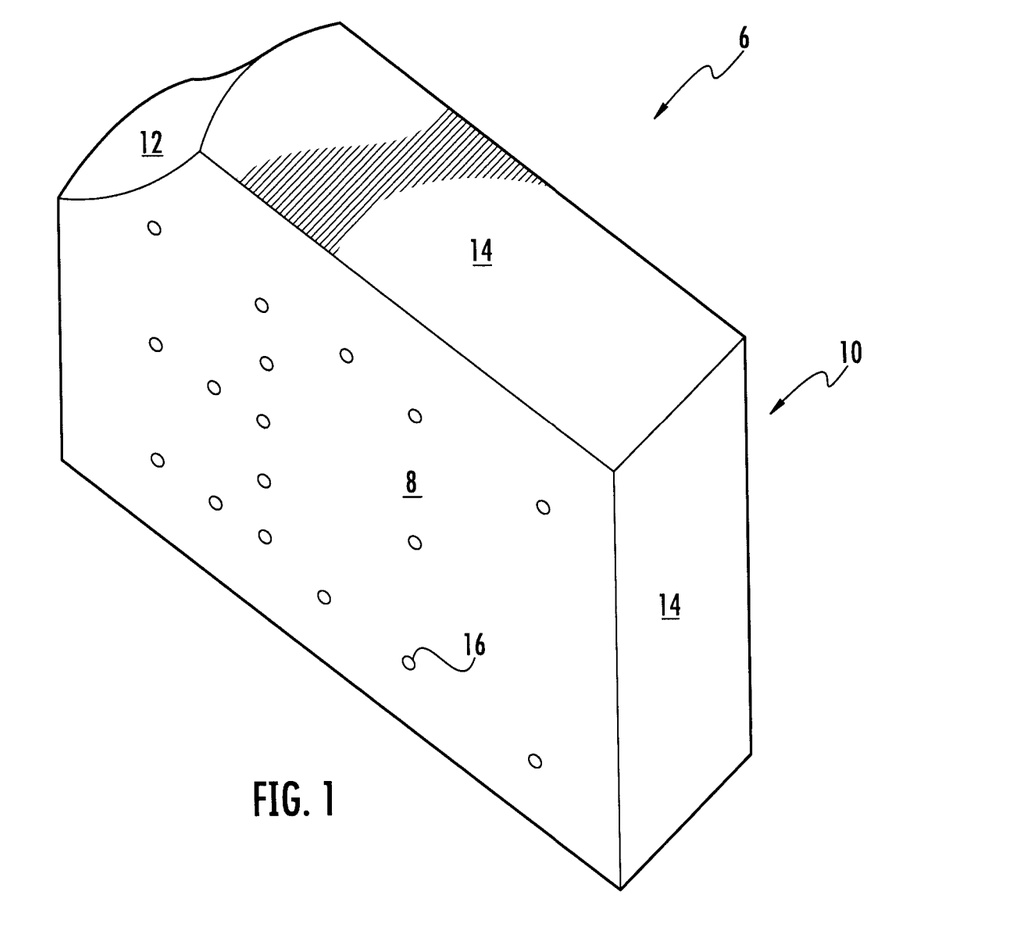
FIG. 1 shows a perspective view of an exemplary flat light distribution body to be used with a light unit in accordance with an exemplary embodiment of the invention.

FIG. 1 shows an exemplary flat light distribution body 6, to be used in light units in accordance with exemplary embodiments of the invention, in a perspective view. The flat light distribution body 6 is a substantially cuboid body of Poly(methylmetacrylate), also referred to as PMMA. The flat light distribution body 6 may also be of other materials, such as polycarbonate, glass or any other suitable material. The flat light distribution body 6 is entirely cuboid, with the exception of a light entry surface 12, which will be described in greater detail below.

The flat light distribution body 6 has a first principal surface 8 and a second principal surface 10, which is opposite of the first principal surface 8 and is not visible in the viewing direction of FIG. 1. Between the first and second principal surface 8, 10, a connection surface 14 and the light entry surface 12 are provided. The connection surface 14 surrounds the cuboid structure between the first and second principal surfaces 8, 10, with the exception of the light entry surface 12. In other words, the connection surface 14 comprises all surfaces of the flat light distribution body 6 that are not the first and second principal surface 8, 10 and are not the light entry surface 12. In the exemplary embodiment of FIG. 1, the extension of the first and second principal surfaces 8, 10 is much greater both in a width and a height dimension than the distance between the first and second principal surfaces 8, 10. In this way, the light distribution body can be considered an overall flat structure.

The first principal surface 8 has a plurality of surface irregularities 16. The plurality of surface irregularities 16 are distributed across the first principal surface 8 in a non-uniform manner, which will be described in greater detail below. In the exemplary embodiment of FIG. 1, the surface irregularities 16 all have a round shape and all have the same size. It is, however, also possible that the surface irregularities 16 have different shapes and/or differ in size.

Figure 2A:
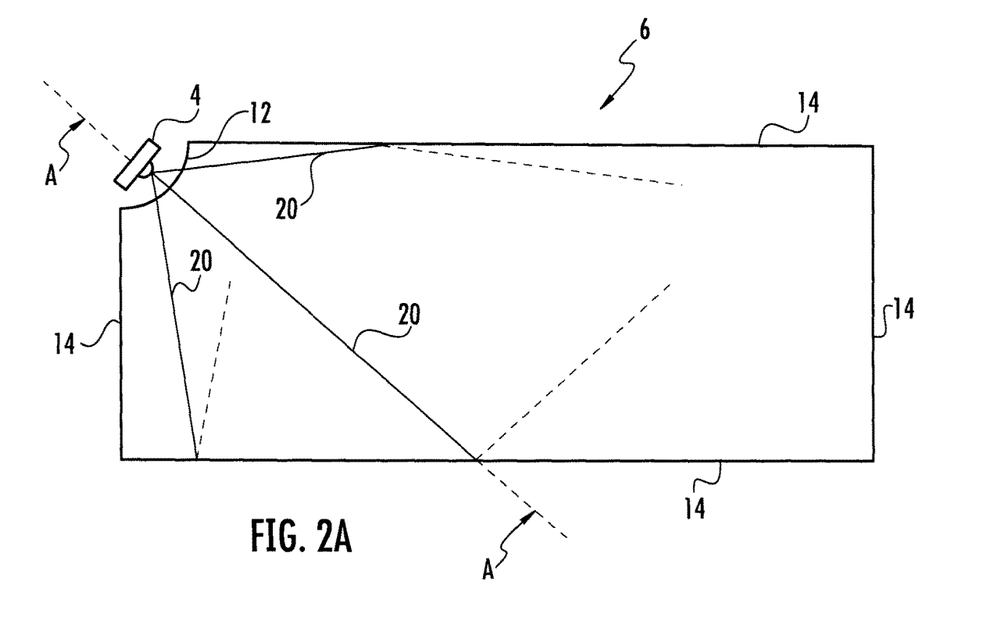
FIG. 2a-FIG. 2b shows two cross-sectional views through the flat light distribution body of FIG. 1, illustrating the light distribution taking place therein.
Figure 2B:
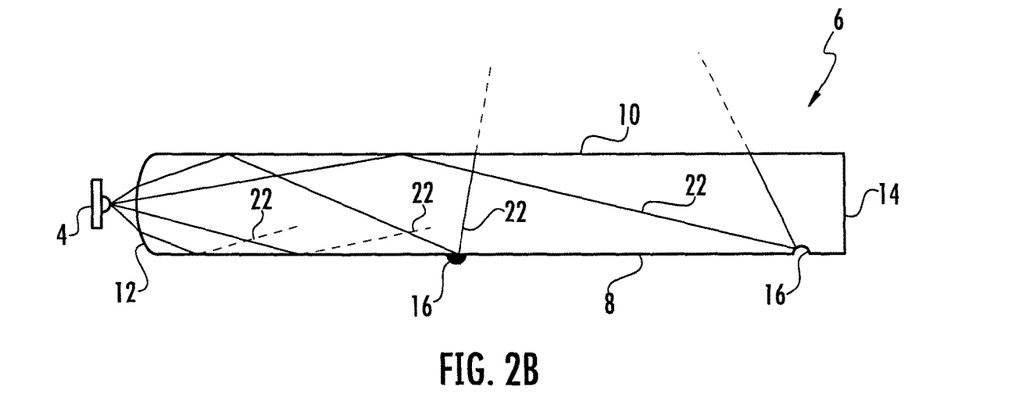

In order to illustrate the light distribution functionality of the flat light distribution body 6 of FIG. 1, two cross-sectional views through the flat light distribution body 6 of FIG. 1 are shown in FIG. 2. FIG. 2a shows a cross-sectional plane that is parallel to the first and second principal surface 8, 10 and is between the first and second principal surfaces 8, 10. FIG. 2a shows both the flat light distribution body 6 and a light source 4 that couples light into the flat light distribution body 4, which light is distributed therein.

The light source 4 is arranged in a way that it faces the light entry surface 12. In particular, it is arranged in the space that is cut out of the hypothetical outline of the flat light distribution body 6, if it were entirely cuboid. In the viewing plane of FIG. 2a, the light source 4 is arranged in the top left corner of the flat light distribution body 6. In the depicted exemplary embodiment, the light source 4 is a single LED.

The connection surface 14, which surrounds the flat light distribution body 6 with the exception of the light entry surface 12, comprises a reflective coating, such that all light hitting the connection surface 14 from within the flat light distribution body 6 experiences reflection at the connection surface 14. The light entry surface 12 has a concave shape in the cross-sectional plane of FIG. 2a, when seen from the light source 4. In this way, the light entry surface 12 surrounds the light source 4 and provides a large surface for coupling the light of the light source 4 into the flat light distribution body 6.

In FIG. 2a, there are depicted three exemplary light rays 20. These light rays 20 illustrate that light emitted by the light source 4 in very different directions is coupled into the flat light distribution body 6 via the light entry surface 12. All the light of the light rays 20 is trapped within the flat light distribution body 6, experiencing reflection when hitting the reflective connection surface 14.

FIG. 2b shows a second cross-sectional view through the flat light distribution body 6 of FIG. 1. In particular, the cross-sectional view of FIG. 2b is orthogonal to the cross-sectional view of FIG. 2a. Further in particular, the cross-sectional view of FIG. 2b is in the viewing direction A-A, indicated in FIG. 2a. In the cross-sectional view of FIG. 2b, the flat light distribution body 6 is circumscribed by the first principal surface 8, the connection surface 14, the second principal surface 10, and the light entry surface 12.

In the cross-sectional plane of FIG. 2b, the light entry surface 12 has a convex shape. This convex shape provides for a refraction of the light emitted by the light source 4 and coupled into the flat light distribution body. This refraction is of such nature that the angle of incidence of the incoming light with respect to the first and second principal surfaces 8, 10 is larger than in the absence of the convex shape of the light entry surface 12. By making the angle of incidence larger, the incoming light can be conditioned in such a way that it is trapped in the flat light distribution body 6 and is propagated therethrough via total internal reflection. In the depicted particular embodiment, all light entering the flat light distribution body 6 has an angle of incidence of more than 60° with respect to the first and second principal surfaces 8, 10. The angle of incidence is defined with respect to the direction normal to the first and second principal surfaces 8, 10. In FIG. 2b, 4 exemplary light rays 22 are shown that illustrate the refraction at the light entry surface 12 and the propagation through the flat light distribution body 6 via total internal reflection.

The coupling out of the light out of the flat light distribution body 6 via surface irregularities 16 is now described. It is pointed out that surface irregularities may have a variety of shapes. Further, different kinds of surface irregularities may be provided. For illustrative purposes, one printed surface irregularity and one geometric surface irregularity, embodied as a hole, are shown in the exemplary embodiment of FIG. 2b. It is understood that the first principal surface 8 has a much greater number than those two depicted surface irregularities. However, for a clearer description of the functionality of the surface irregularities, only two are shown in FIG. 2b.

Each of the surface irregularities 16 has the effect that the light arriving at the surface irregularities 16 changes its path through the flat light distribution body 6 in a different manner as compared to light hitting the first and second principal surfaces 8-10 at positions where no surface irregularities are present. In particular, the angle of reflection at such surface irregularities 16 is different from the angle of incidence, when looked at both angles with respect to the first principal surface 8. This is illustrated by two of the light rays 22 that are depicted as arriving at the surface irregularities 16 at angles of incidence of more than 60°. These light rays 22 leave the surface irregularities at angles of reflection that are much less than the angles of incidence with respect to the first principal surface 8. For the two depicted light rays, the angle of reflection is below 30°. As the angles of reflection are below the critical angle of the material of the flat light distribution body 6, these light rays 22 exit the flat light distribution body 6 at the next surface they hit, i.e. at the second principal surface 10. In this way, a coupling out of the light is achieved via the reflection at the surface irregularities 16.

Figure 3:
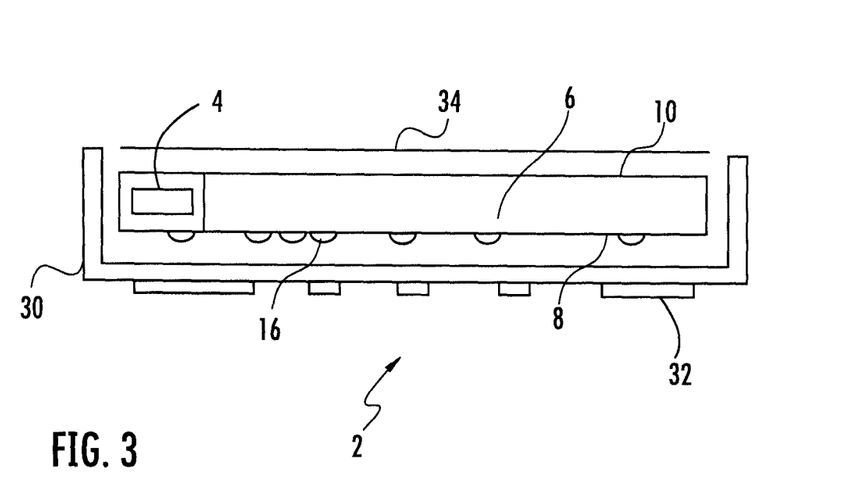
FIG. 3 shows a first exemplary embodiment of a light unit in accordance with the invention.

FIG. 3 shows a light unit 2 in accordance with an exemplary embodiment of the invention in a top view. The light unit 2 has a flat light distribution body 6, embodied substantially as described with respect to FIGS. 1 and 2. In the top view of FIG. 3, the upper connection surface 14 and the light entry surface 12 are shown as extended structures. Further, the surface imperfections 16 are shown as extending beyond the first principal surface 8. Further, the light source 4 is depicted.

A diffuse white reflector 34 is arranged along the second principal surface 10 of the flat light distribution body 6. Further, a translucent cover 30 is arranged around the flat white distribution body 6 at those three sides that are not associated with the diffuse white reflector 34. On the side of the first principal surface 8, the translucent cover 30 comprises markings 32 that provide for the signaling capability of the light unit 2. In particular, the markings 32 of the exemplary embodiment of FIG. 3 are transparent red markings in the shape of the four letters of the word EXIT, indicating the exit locations to the passengers of an aircraft. Accordingly, the exemplary light unit 2 or FIG. 3 is an interior aircraft exit light unit.

The operation of the light unit 2 of FIG. 3 is described as follows. Light is emitted by the light source 4 and coupled into the flat light distribution body 6 via the light entry surface 12. This light propagates within the flat flight distribution body 6 until it hits one of the surface irregularities 16. At the surface irregularities 16, at least some of the light hitting the surface irregularities 16 is reflected in such a way that it reaches the second principal surface 10 at an angle that is smaller than the critical angle. In this way this light leaves the flat light distribution body 6 towards the diffuse white reflector 34. At the diffuse white reflector 34, the light is diffusely reflected towards the flat light distribution body 6. The light re-enters the flat light distribution body 6, travels from the second principal surface 10 to the first principal surface 8 and re-exits the flat light distribution body 6. By the action of the plurality of surface irregularities 16 and the diffuse white reflector 34, a light emission from the first principal surface is achieved. In other words, the first principal surface 8 is an extended light emission surface of the light unit 2. From there, the light travels through the translucent cover 2, illuminating the exit markings 32 and the remainder of the translucent cover 30 in different manners, thus achieving the desired signaling functionality.

Figure 4:
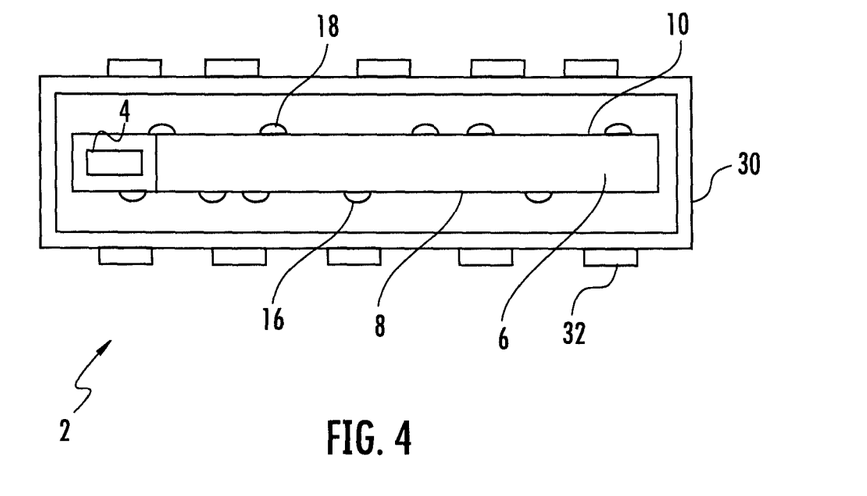
FIG. 4 shows a second exemplary embodiment of a light unit in accordance with the invention.

FIG. 4 shows a light unit 2 in accordance with a second exemplary embodiment of the invention. The light unit 2 of FIG. 4 differs from the light unit 2 of FIG. 3 in that no white diffuse reflector is provided and in that the translucent cover 30 surrounds the flat light distribution body 6 on all sides in the top view of FIG. 4. In particular, the translucent cover 30 is arranged along both the first principal surface 8 and the second principal surface 10. In the absence of the white diffuse reflector, the light reflected by the surface irregularities 16 at an angle smaller than the critical angle finally exits the flat light distribution body at the second principal surface 10. In this way, the second principal surface 10 is an extended light emission surface of the light unit 2. This light then leaves the light unit 2 via the portion of the translucent cover 30 arranged alongside the second principal surface 10.

The light unit 2 of FIG. 4 also deviates from the light unit 2 of FIG. 3 in that a plurality of second surface irregularities 18 are provided on the second principal surface 10. The light reflected by the second surface irregularities 18 at an angle below the critical angle exits the flat light distribution body 6 at the first principal surface 8, making the first principal surface an extended light emission surface of the light unit 2. In this way, the first and second principal surface 8, 10 are both extended light emission surfaces, leading to the light unit 2 shining light through the translucent cover 30 to two sides.

FIG. 5 illustrates an exemplary process for designing a non-uniform distribution of surface irregularities 16 that allows for reaching a highly even output light intensity distribution of an exemplary light unit 2. In FIG. 5, a light unit 2 substantially as shown in FIG. 3 is to be designed. The light unit is shown from a front view without the translucent cover. Accordingly, in the viewing direction of FIG. 5a, the first principal surface 8 of the flat light distribution body 6 and the light source 4 are visible. Further, a starting pattern of surface irregularities 16 is shown. In the exemplary embodiment of FIG. 5a, the starting pattern is a regular grid of surface irregularities 16.

Figure 5A:
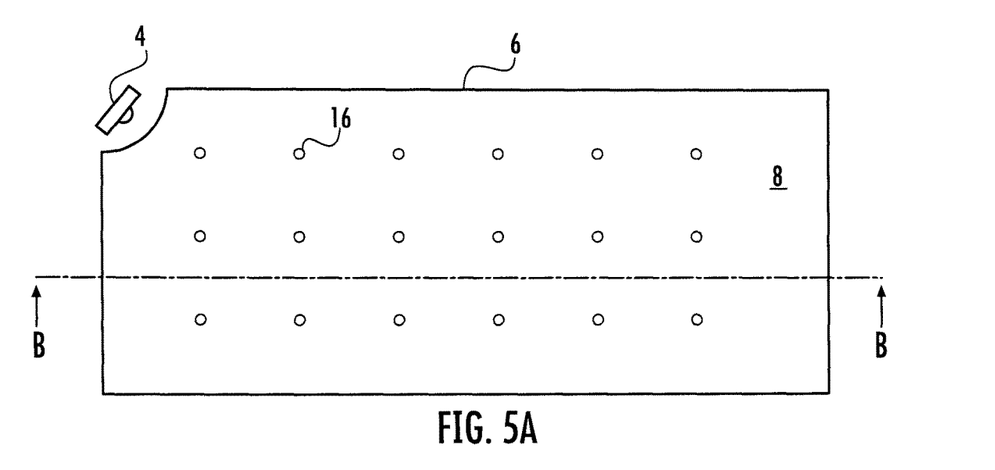

On the basis of the geometric extension and the material of the flat light distribution body 6, of the position of the light source 4 with respect to the flat light distribution body 6, of the starting pattern of the surface irregularities 16, and of a model of the diffuse white reflector 34, which is arranged behind the flat light distribution body 6 in the viewing direction of FIG. 5a, the operation of the light unit is simulated. Such simulation may be done via suitable computing means, such as a computer with suitable programs. As the result of such simulation, the output light intensity distribution across the first principal surface 8 may be computed.

Figure 5B:
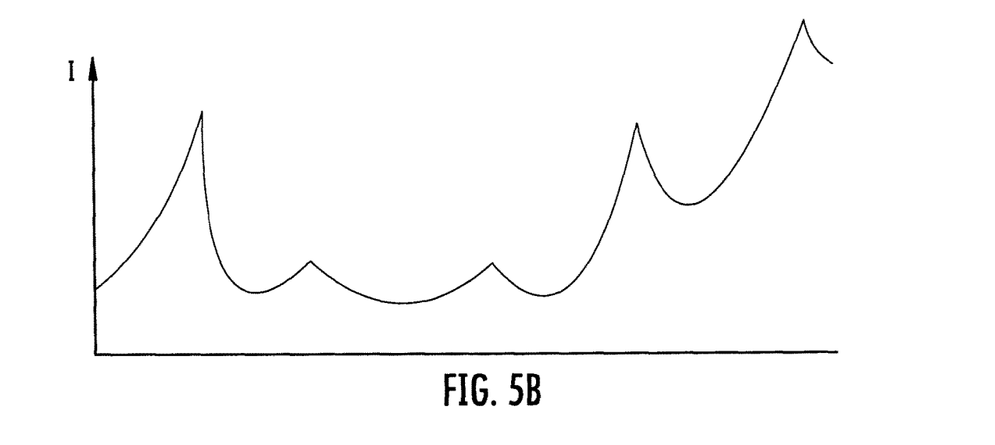

An exemplary extract of that output light intensity distribution is shown in FIG. 5b. In particular, the simulated output light intensity values along line B-B, depicted in FIG. 5a are shown in FIG. 5b. This extract of the output light intensity distribution has a ratio between its maximum light intensity and its minimum light intensity of about 10. Accordingly, the ratio of the maximum light intensity across the entire first principal surface and the minimum light intensity across the entire first principal surface is at least 10. It can be seen from the extract of the output light intensity distribution, depicted in FIG. 5b, that the output light intensity has generally higher values towards the right of the first principal surface 8 and has generally lower intensity values slightly towards the left of the center of the first principal surface 8.

Figure 5C:
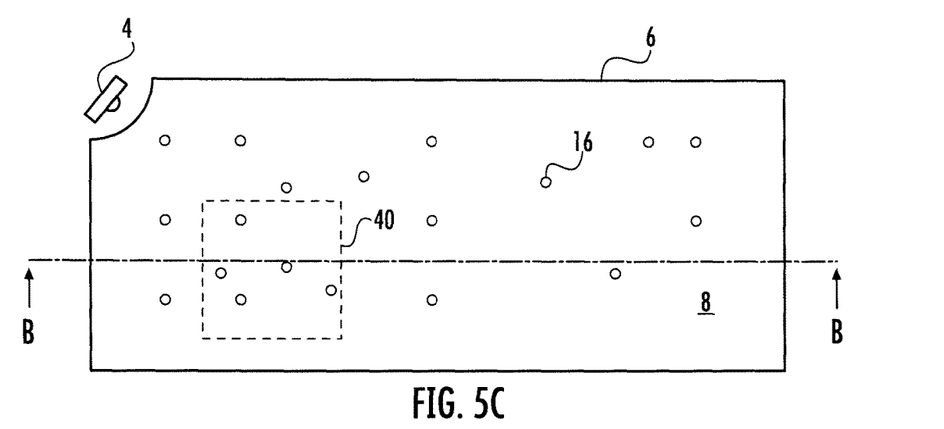

On the basis of these observations, the starting pattern of the surface irregularities 16 is adjusted. In particular, additional surface irregularities are provided slightly towards the left of the center of first principal surface 8, and surface irregularities are removed from the right end of the first principal surface 8. The resulting adjusted distribution of the surface irregularities 16 is illustrated in FIG. 5*c*.

Figure 5D:
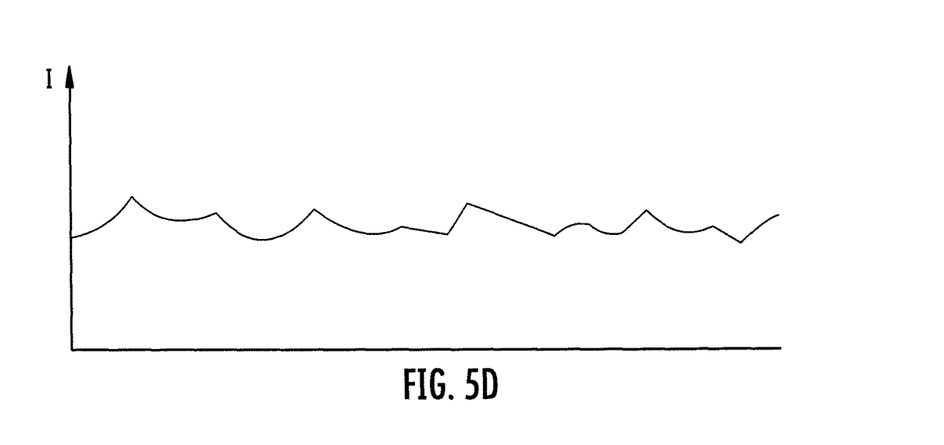

After this adjustment, the operation of the light unit is simulated again, as described above. The resulting output light intensity distribution differs from the starting output light intensity distribution. In FIG. 5*d*, an extract of this output light intensity distribution along line B-B is shown again. In the present case, the output light intensity distribution along line B-B has changed in such a way that the ratio between the maximum light intensity and the minimum light intensity is around 3. In this way, a much more even output light intensity distribution has been achieved by the adjustment of the distribution of the surface irregularities 16. In particular, in above discussed sub-regions towards the left of the center of the first principal surface 8, a substantially increased density of surface irregularities is provided. In particular, the surface irregularity density in sub-region 40 is at least 50% higher than average surface irregularity density across the whole first principal surface 8. It can also be said that the regional irregularity ratio in the sub-region 40 is at least 50% higher than the total irregularity ratio across the whole first principal surface 8.

It is pointed out that the method of designing the light unit, as illustrated in FIG. 5*a* to 5*d*, is schematic and simplified. In reality, multiple iterations may be carried out in order to reach a desired output light intensity distribution across the entire first principal surface 8.

Further, it is pointed out that, instead of or in addition to changing the number of surface irregularities, the size of the surface irregularities can be adjusted. In particular, the size of the surface irregularities in regions with low output light intensity values can be increased and/or the size of the surface irregularities in regions with high output light intensity values can be decreased. Accordingly, the changing of the size/extension of the surface irregularities is an alternative means for adjusting the regional irregularity ratio.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed, but that the invention will include all embodiments falling within the scope of the appended claims.

The invention claimed is:

1. A light unit with an extended light emission surface, comprising
    a light source, and
    a flat light distribution body having a first principal surface and a second principal surface disposed on opposite sides of the flat light distribution body,
    wherein the light source is positioned outside of the flat light distribution body, with light emitted by the light source being coupled into the flat light distribution body and being propagated within the flat light distribution body via total internal reflection at the first and second principal surfaces,
    wherein the flat light distribution body has a substantially cuboid shape and wherein the light source is arranged in a corner region of the flat light distribution body, with light from the light source being coupled into the flat light distribution body via a light entry surface,
    wherein the light entry surface has a concave shape, when seen from the light source, in a cross-sectional plane parallel to the first principal surface and wherein the light entry surface has a convex shape, when seen from the light source, in a cross-sectional plane orthogonal to the first principal surface,
    wherein the first principal surface has a plurality of surface irregularities, wherein light arriving at a surface irregularity at an angle of incidence is reflected at an angle of reflection that is different from the angle of incidence with respect to the first principal surface, with the angle of reflection allowing for the light to be coupled out of the flat light distribution body,
    wherein a total irregularity ratio of the first principal surface is defined as a combined area of the plurality of surface irregularities on the first principal surface divided by a total area of the first principal surface and wherein a regional irregularity ratio is defined as a combined area of a subset of the plurality of surface irregularities in a sub-region of the first principal surface divided by a total area of said sub-region of the first principal surface, wherein the first principal surface has at least one square sub-region whose area is 10% of the total area of the first principal surface and whose regional irregularity ratio is at least 50% higher than the total irregularity ratio, and
    wherein the first principal surface is the extended light emission surface and wherein the light unit comprises an extended reflector arranged outside of the flat light distribution body alongside the second principal surface, with the light being coupled out of the flat light distribution body at the first principal surface after being reflected at the plurality of surface irregularities on the first principal surface, travelling through the flat light distribution body, leaving the flat light distribution body at the second principal surface, being reflected at the extended reflector, entering the flat light distribution body via the second principal surface, and travelling through the flat light distribution body.

2. The light unit according to claim 1, wherein the extended reflector is a diffuse reflector, in particular a white diffuse reflector.

3. The light unit according to claim 1, wherein the second principal surface has a plurality of second surface irregularities, wherein light arriving at a second surface irregularity at an angle of incidence is reflected at an angle of reflection that is different from the angle of incidence with respect to the second principal surface, with the angle of reflection allowing for the light to be coupled out of the flat light distribution body.

4. The light unit according to claim 3,
    wherein light is being coupled out of the flat light distribution body at the first principal surface after being reflected at the plurality of second surface irregularities on the second principal surface.

5. The light unit according to claim 1, wherein the light source is an LED light source.

6. The light unit according to claim 1, wherein a distribution of the plurality of surface irregularities is such that an output light intensity distribution across the extended light emission surface has a ratio between its maximum light intensity and its minimum light intensity of at most 3.

7. The light unit according to claim 1, wherein the plurality of surface irregularities comprises holes in the first principal surface and/or wherein the plurality of surface irregularities comprises dots attached to the outside of the first principal surface.

8. The light unit according to claim 1, wherein the light unit is an interior aircraft light unit.

9. A method of designing a light unit with an extended light emission surface, comprising the steps of:
(a) defining a geometry of a flat light distribution body, having a first principal surface, a second principal surface, and a light entry surface, wherein the flat light distribution body has a substantially cuboid shape,
(b) defining a position and a light intensity distribution of a light source, facing the light entry surface, wherein the light source is arranged in a corner region of the flat light distribution body, with light from the light source being coupled into the flat light distribution body via a light entry surface, wherein the light entry surface has a concave shape, when seen from the light source, in a cross-sectional plane parallel to the first principal surface and wherein the light entry surface has a convex shape, when seen from the light source, in a cross-sectional plane orthogonal to the first principal surface,
(c) defining a starting pattern of a plurality of surface irregularities on the first principal surface,
(c') arranging an extended reflector outside of the flat light distribution body alongside the second principal surface, with light being coupled out of the flat light distribution body at the first principal surface after being reflected at the plurality of surface irregularities on the first principal surface, travelling through the flat light distribution body, leaving the flat light distribution body at the second principal surface, being reflected at the extended reflector, entering the flat light distribution body via the second principal surface, and travelling through the flat light distribution body, the first principal surface being the extended light emission surface,
(d) simulating an operation of the light unit and analysing an output light intensity distribution across the extended light emission surface,
(e) determining a maximum light intensity and a minimum light intensity of the output light intensity distribution and determining a ratio between the maximum light intensity and the minimum light intensity,
(f) if the ratio between the maximum light intensity and the minimum light intensity is above a predetermined threshold, increasing the number and/or the size of the surface irregularities in regions with low output light intensity values.

10. The method according to claim 9, wherein steps (d) to (f) are performed iteratively, until the ratio between the maximum light intensity and the minimum light intensity is below the predetermined threshold.

11. The light unit according to claim 1, wherein the extended reflector is a white diffuse reflector.

12. The light unit according to claim 1, wherein the light source is an LED light source consisting of exactly one LED.

13. The light unit according to claim 1, wherein the light unit is an interior aircraft exit light or an aircraft wash room signal light unit.

* * * * *